United States Patent
Kong et al.

(10) Patent No.: US 12,160,233 B2
(45) Date of Patent: Dec. 3, 2024

(54) QUANTUM CIRCUIT, QUANTUM CHIP, AND QUANTUM COMPUTER

(71) Applicant: ORIGIN QUANTUM COMPUTING TECHNOLOGY (HEFEI) CO., LTD, Anhui (CN)

(72) Inventors: Weicheng Kong, Anhui (CN); Song Li, Anhui (CN); Zhenquan Yang, Anhui (CN); Junxiu Bu, Anhui (CN)

(73) Assignee: ORIGIN QUANTUM COMPUTING TECHNOLOGY (HEFEI) CO., LTD., Anhui (CN)

( * ) Notice: Subject to any disclaimer, the term of this patent is extended or adjusted under 35 U.S.C. 154(b) by 0 days.

(21) Appl. No.: 18/533,086

(22) Filed: Dec. 7, 2023

(65) Prior Publication Data
US 2024/0322823 A1    Sep. 26, 2024

Related U.S. Application Data

(63) Continuation of application No. PCT/CN2022/108653, filed on Jul. 28, 2022.

(30) Foreign Application Priority Data

Jul. 30, 2021 (CN) .......................... 202110868313.9
Aug. 17, 2021 (CN) .......................... 202110941249.2
(Continued)

(51) Int. Cl.
*H03K 17/92* (2006.01)
*G06N 10/40* (2022.01)
(Continued)

(52) U.S. Cl.
CPC ............. *H03K 17/92* (2013.01); *G06N 10/40* (2022.01); *H01P 7/065* (2013.01); *H10N 69/00* (2023.02)

(58) Field of Classification Search
CPC ....................................................... H03K 17/92
(Continued)

(56) References Cited

U.S. PATENT DOCUMENTS

2020/0395405 A1* 12/2020 Barends ................. G06N 10/00

FOREIGN PATENT DOCUMENTS

| CN | 107924489 A | 4/2018 |
| CN | 110472740 A | 11/2019 |

(Continued)

OTHER PUBLICATIONS

ISA China National Intellectual Property Administration, International Search Report Issued in Application No. PCT/CN2022/108653, Oct. 10, 2022, WIPO, 6 pages.

*Primary Examiner* — Tomi Skibinski
(74) *Attorney, Agent, or Firm* — McCoy Russell LLP

(57) ABSTRACT

A quantum circuit, a quantum chip, and a quantum computer. The quantum circuit includes qubits, adjacent qubits being coupled, and each of the qubits including: a first capacitor, a first end of the first capacitor being grounded; a second capacitor, a first end of the second capacitor and the first end of the first capacitor being commonly grounded; and a first device, including a first squid and a third capacitor that are connected in parallel, wherein parallel-connected first ends of the first squid and the third capacitor are connected to a second end of the first capacitor, and parallel-connected second ends of the first squid and the third capacitor are connected to a second end of the second capacitor. According to the present disclosure, parameters of at least one of a plurality of capacitors in a qubit circuit can be adjusted, so that the design of the capacitor is more flexible and less spatially limited, which facilitates design and layout of other circuit structures.

20 Claims, 9 Drawing Sheets

(30) Foreign Application Priority Data

Aug. 27, 2021 (CN) .......................... 202110991984.4
Sep. 17, 2021 (CN) .......................... 202122267316.5

(51) Int. Cl.
  *H01P 7/06* (2006.01)
  *H10N 69/00* (2023.01)

(58) Field of Classification Search
  USPC .......................................................... 327/528
  See application file for complete search history.

(56) References Cited

FOREIGN PATENT DOCUMENTS

| | | |
|---|---|---|
| CN | 111931940 A | 11/2020 |
| CN | 215729853 U | 2/2022 |

\* cited by examiner

Form a first capacitive plate and a second capacitive plate of each qubit on a substrate, wherein the first capacitive plate includes a first arm and a second arm that intersect with each other, the second capacitive plate includes a third arm and a fourth arm that intersect with each other, and one of the first arm and the second arm of one of the qubits is coupled to one of the third arm and the fourth arm of a qubit adjacent to one of the qubits ⎯ S501

Form a squid on the substrate, wherein the squid has one end connected to the first capacitive plate and the other end connected to the second capacitive plate ⎯ S502

FIG. 6

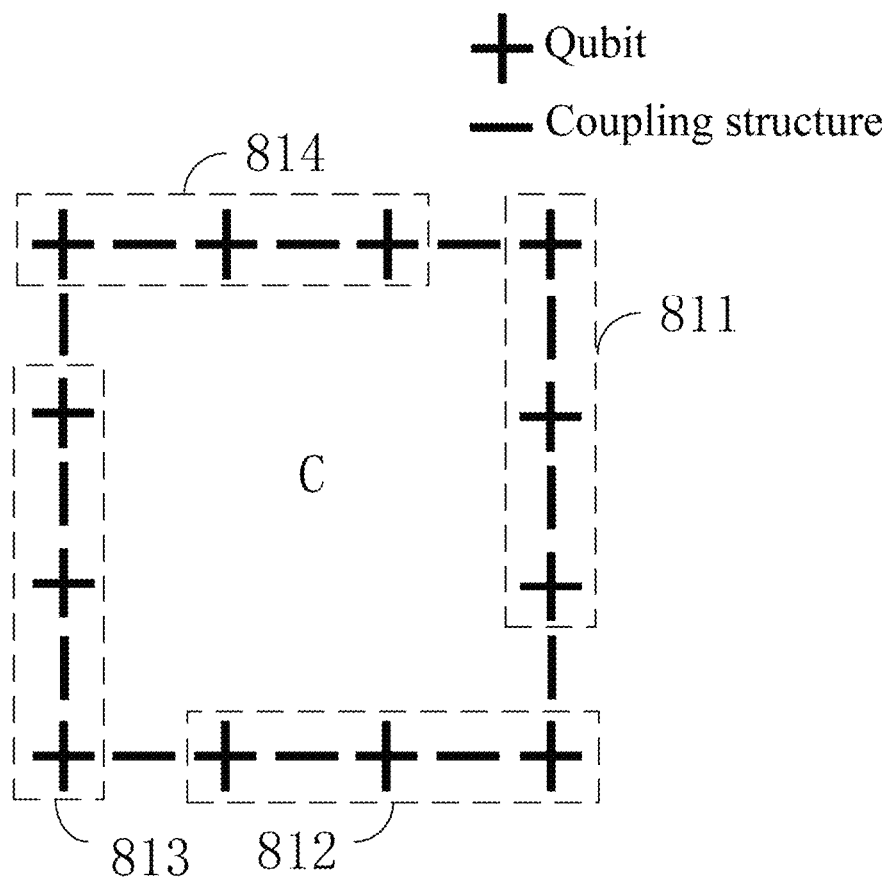

FIG. 7

QUANTUM CIRCUIT, QUANTUM CHIP, AND QUANTUM COMPUTER

CROSS REFERENCE TO RELATED APPLICATIONS

The present application is a U.S. Bypass Continuation of International Application No. PCT/CN2022/108653, entitled "QUANTUM CIRCUIT, QUANTUM CHIP, AND QUANTUM COMPUTER", and filed on Jul. 28, 2022. International Application No. PCT/CN2022/108653 claims priority to Chinese Patent Application No. 202110868313.9, entitled "QUANTUM CHIP AND MANUFACTURING METHOD THEREOF, AND QUANTUM COMPUTER" and filed with the China Patent Office on Jul. 30, 2021, claims priority to Chinese Patent Application No. 202110941249.2, entitled "QUANTUM COMPUTING CIRCUIT AND QUANTUM COMPUTER" and filed with the China Patent Office on Aug. 17, 2021, claims priority to Chinese Patent Application No. 202110991984.4, entitled "SUPERCONDUCTING QUANTUM CHIP AND QUANTUM COMPUTER" and filed with the China Patent Office on Aug. 27, 2021, and claims priority to Chinese Patent Application No. 202122267316.5, entitled "QUANTUM CHIP AND QUANTUM COMPUTER" and filed with the China Patent Office on Sep. 17, 2021, the entire contents of which are incorporated herein by reference.

TECHNICAL FIELD

The present disclosure belongs to the field of quantum information, especially the technical field of quantum computing. In particular, the present disclosure relates to a quantum circuit, a quantum chip, and a quantum computer.

BACKGROUND

A quantum computer is a physical apparatus that follows laws of quantum mechanics to perform high-speed mathematical and logical operations, store and process quantum information. The quantum computer is mainly featured with a fast operation speed, a strong capability of processing information, a wide application range, and the like. Compared with ordinary computers, when more information is processed, it is more beneficial for the quantum computer to perform calculations, and more accurate calculations can be ensured.

In superconducting quantum computing, qubits may be prepared on a substrate by using a micro-nano machining technology, which has excellent performance such as integration and scalability. In recent years, the superconducting quantum computing has developed rapidly. A current qubit structure generally includes a single ground capacitor, and a superconducting quantum interference device (SQUID) with one end grounded and the other end connected to the capacitor. However, it is spatially limited to some extent to design and manufacture a quantum circuit by using this structure, which easily affects design and layout of other circuit structures.

SUMMARY

The present disclosure provides a quantum circuit, a quantum chip, and a quantum computer, to solve the deficiencies in the related art and facilitate design and layout of other circuit structures.

In a first aspect, some embodiments of the present disclosure provide a quantum circuit, including qubits, adjacent qubits being coupled, and each of the qubits including: a first capacitor, a first end of the first capacitor being grounded; a second capacitor, a first end of the second capacitor and the first end of the first capacitor being commonly grounded; and a first device, including a first squid and a third capacitor that are connected in parallel, wherein parallel-connected first ends of the first squid and the third capacitor are connected to a second end of the first capacitor, and parallel-connected second ends of the first squid and the third capacitor are connected to a second end of the second capacitor.

In the quantum circuit provided in some embodiments of the present disclosure, the qubit includes a plurality of capacitors, and anharmonicity of a qubit energy level system is affected by the plurality of capacitors. Compared with the quantum circuit in the related art, in the qubit circuit of the present disclosure, selection and combination of capacitors is relatively flexible, and when anharmonic parameters of the qubit energy level system are determined, parameters of at least one of the plurality of capacitors may be adjusted as required. This structure prevents the space limitations caused when the qubit in the quantum circuit of the related art includes a capacitor with one end grounded and a squid connected in parallel with the capacitor. Therefore, the solution provided in some embodiments of the present disclosure facilitates design and layout of other circuit structures.

In some embodiments, the first capacitor includes a first capacitive plate, the second capacitor includes a second capacitive plate, and the third capacitor is formed between the first capacitive plate and the second capacitive plate;
parallel-connected first ends of the first squid and the third capacitor being connected to a second end of the first capacitor includes: the first end of the first squid is connected to the first capacitive plate; and
parallel-connected second ends of the first squid and the third capacitor being connected to a second end of the second capacitor includes: the second end of the first squid is connected to the second capacitive plate.

In some embodiments, the first capacitive plate includes a first arm and a second arm that intersect with each other; and the second capacitive plate includes a third arm and a fourth arm that intersect with each other.

In some embodiments, the first end of the first squid being connected to the first capacitive plate includes: the first end of the first squid is connected to an intersection of the first arm and the second arm; and/or the second end of the first squid being connected to the second capacitive plate includes: the second end of the first squid is connected to an intersection of the third arm and the fourth arm.

In the quantum circuit provided in some embodiments of the present disclosure, the qubit includes a first capacitive plate having a first arm and a second arm that intersect, a second capacitive plate having a third arm and a fourth arm that intersect, and a first squid with one end connected to the first capacitive plate and the other end connected to the second capacitive plate. The qubit having this structure facilitates two-dimensional arrangement. Two of the qubits at adjacent positions in a two-dimensionally arranged array form a coupling, that is, any qubit is coupled to four qubits adjacent thereto to realize communication, so as to realize expansion of the number of qubits on the substrate.

The first squid in some embodiments of the present disclosure may have no direct physical contact with a ground plane (GND). Therefore, an operation on the ground plane (GND) during manufacturing and testing of the quantum chip can prevent damages to the first squid. Moreover, compared with a structure of a single ground capacitor, the first capacitive plate and the second capacitive plate that form a capacitor with the ground plane (GND) have larger physical sizes, and a space reserved for wiring on the substrate is larger in the two-dimensional arrangement, which can accommodate structures such as a read resonant cavity and a control signal line.

In some embodiments, the first arm is orthogonal to the second arm, and the third arm is orthogonal to the fourth arm.

In some embodiments, the adjacent qubits being coupled includes: one of the first arm and the second arm of one of the qubits is coupled to one of the third arm and the fourth arm of a qubit adjacent one of the qubits.

In some embodiments, a capacitance value $C_1$ of the first capacitor, a capacitance value $C_2$ of the second capacitor, and a capacitance value $C_3$ of the third capacitor satisfy:

$$C_1 = C_2, \text{ and } C_3 \le \frac{c_2}{100}.$$

In some embodiments, the qubits are arranged in an array on a substrate; and basic units arranged in the array form bit units, and the qubits of one bit unit of the bit units on a same straight line form a bit one-dimensional chain.

In some embodiments, at least 3 of the qubits form a bit one-dimensional chain, adjacent qubits in the bit one-dimensional chain are coupled, and a plurality of bit one-dimensional chains are sequentially coupled and connected end to end to form the bit unit.

In some embodiments, the bit unit formed by the bit one-dimensional chains is in a shape of a quadrilateral, a pentagon, or a hexagon.

In some embodiments, the quadrilateral formed by the one-dimensional bit chains has a square shape or a rhombus shape.

In some embodiments, the quantum circuit further includes: read resonant cavities and a control circuit, wherein the read resonant cavities are located in an internal space or external space of the bit unit, the control circuit is at least partially located in the internal space or external space of the bit unit, and the read resonant cavities and the control circuit are coupled to the qubits.

In the quantum circuit provided in some embodiments of the present disclosure, the bit unit includes a plurality of bit one-dimensional chains sequentially coupled and connected end to end, the bit one-dimensional chain includes at least three qubits, adjacent qubits are coupled and connected, read resonant cavities are located in an internal space or external space of the bit unit, a control circuit is at least partially located in the internal space or external space of the bit unit, and the read resonant cavities and the control circuit are coupled and connected to the qubits. Therefore, by use of the quantum circuit provided in some embodiments of the present disclosure, the internal space and external space of the bit unit can be adjusted according to the number and/or physical sizes of the qubits included in the bit one-dimensional chain, so that a large space can be reserved to facilitate design and layout of structures such as the read resonant cavity and a measurement and control signal transmission line. For example, a read resonant cavity and a control line coupled to the qubit can be formed in the internal space and the external space, thereby solving the problem in the related art that it is difficult to have enough space to arrange structures such as the read resonant cavity and the measurement and control signal transmission line in the case of integration and expansion of qubits, which helps to realize integration and expansion of a large number of qubits on the substrate.

In some embodiments, the read resonant cavities coupled to the qubits in a same bit one-dimensional chain are distributed on a same side of the same bit one-dimensional chain.

In some embodiments, the read resonant cavities are all located in the internal space.

In some embodiments, the substrate includes a first base and a second base; and the read resonant cavities being located in the internal space or external space of the bit unit, the control circuit being at least partially located in the internal space or external space of the bit unit, and the read resonant cavities and the control circuit being coupled to the qubits includes:
a first part of the control circuit is located on the first base;
the bit unit, the read resonant cavities, and a second part of the control circuit are located on the second base; and
the first part is coupled to the qubits, and the second part is electrically connected to the first part.

In some embodiments, a second part of the control circuit being located on the second base includes:
a through-hole is formed in the second base, and the second part is located in the through-hole.

In some embodiments, a coupling structure is further formed between two adjacent qubits.

In some embodiments, the coupling structure is coupled to one of the first arm and the second arm of one of the qubits, and is also coupled to one of the third arm and the fourth arm of another qubit adjacent to the one of the qubits.

In some embodiments, a frequency of the coupling structure is tunable.

In some embodiments, the coupling structure includes a fourth capacitor having one end grounded, and a second squid connected in parallel with the fourth capacitor.

In some embodiments, the first squid includes Josephson junctions connected in parallel; and/or
the second squid includes Josephson junctions connected in parallel.

In some embodiments, a number of the Josephson junctions in the second squid is an odd number.

In some embodiments, the Josephson junctions are tunnel junctions, point contacts, or have other structures exhibiting a Josephson effect.

In some embodiments, the quantum circuit further includes a readout circuit, and the readout circuit is coupled to the qubits.

In some embodiments, the readout circuit includes a fifth capacitor having one end grounded, and an inductor connected in parallel with the fifth capacitor.

In some embodiments, the readout circuit is capacitively coupled to the qubits.

In a second aspect, some embodiments of the present disclosure provide a quantum circuit, including qubits, adjacent qubits being coupled, and each of the qubits including:
a first capacitor, a first end of the first capacitor being grounded; and
a first device, including a first squid; wherein a first end of the first squid is connected to a second end of the first capacitor, and a second end of the first squid is grounded.

In some embodiments, the first capacitor includes: a first capacitive plate; and a first end of the first squid being connected to a second end of the first capacitor includes: the first end of the first squid is connected to the first capacitive plate.

In some embodiments, the first capacitive plate includes electrodes having a same intersection; and the adjacent qubits being coupled includes: a coupled connection is formed between the adjacent qubits through one of the electrodes.

The quantum circuit provided in the present disclosure includes a plurality of qubits. Each of the qubits includes a first capacitive plate grounded, and a first squid with one end connected to the first capacitive plate and the other end connected to the ground. The first capacitive plate includes a plurality of electrodes having a same intersection, and the qubits at adjacent positions form a coupled connection through one of the plurality of electrodes. The number of electrodes that the first capacitive plate has is expanded, so that the number of qubits in which one qubit establishes a coupled connection through the electrodes of the first capacitive plate increases, thereby improving connectivity between the qubits on the quantum chip and overcoming the limitations brought by the structure in the related art.

In some embodiments, the first end of the first squid being connected to the first capacitive plate includes:

one end of the first squid is connected to the intersection.

In some embodiments, a coupling structure is further formed between two adjacent qubits; the coupling structure is coupled to one of the electrodes of one of the qubits, and is also coupled to one of the electrodes of another qubit that is adjacent to the one of qubits.

In some embodiments, a frequency of the coupling structure is tunable.

In some embodiments, the coupling structure includes a ground fourth capacitive plate; a third squid having one end connected to the fourth capacitive plate and another end that is grounded, and a magnetic flux modulation line coupled to the third squid.

In some embodiments, the fourth capacitive plate includes a first portion, a second portion, and a third portion connecting the first portion and the second portion, and one of the electrodes of one of the qubits and one of the electrodes of another qubit that is adjacent to the one of the qubits are respectively located on two sides of the third portion and both located between the first portion and the second portion.

In a third aspect, some embodiments of the present disclosure provide a quantum chip, including the quantum circuit in the first aspect or the second aspect.

In a fourth aspect, some embodiments of the present disclosure provide a quantum computer, including the quantum circuit in the first aspect or the second aspect.

BRIEF DESCRIPTION OF DRAWINGS

In order to more clearly illustrate the technical solutions in some embodiments of the present disclosure, the accompanying drawings used in the description of the embodiments will be briefly introduced below. It is apparent that, the accompanying drawings in the following description are only some embodiments of the present disclosure, and other drawings can be obtained by those of ordinary skill in the art from the provided drawings without creative efforts.

FIG. 6 is a flowchart of a manufacturing method for a quantum chip according to some embodiments of the present disclosure;

FIG. 7 is a schematic diagram of distribution of components of a superconducting quantum chip according to some embodiments of the present disclosure;

REFERENCE SIGNS

Figure 1A:
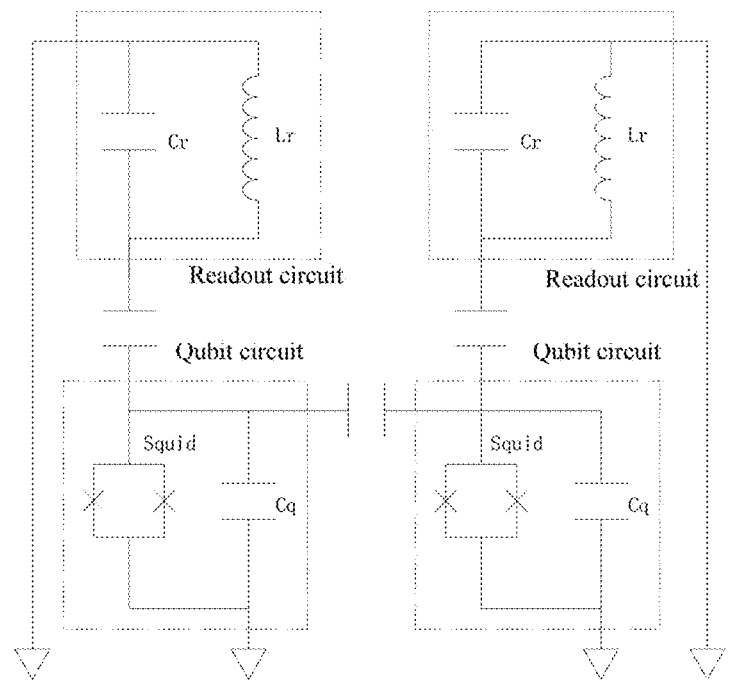
FIG. 1A is a schematic diagram of a quantum circuit in the related art.

1: qubit, 2: coupling structure,

11: first capacitive plate, 12: second capacitive plate, 13: first squid, 14: pulse modulation line, 15: first magnetic flux modulation line, 16: read resonant cavity, 111: first arm, 112: second arm, 121: third arm, 122: fourth arm, 21: third capacitive plate, 22: second squid, 23: second magnetic flux modulation line, 81: superconducting quantum chip, 811: first bit one-dimensional chain, 812: second bit one-dimensional chain, 813: third bit one-dimensional chain, 814: fourth bit one-dimensional chain, 82: first chip, 821: first base, 822: first control circuit, 823: control connecting portion, 824: first readout circuit, 825: read connecting portion, 83: second chip, 831: second base, 833: second control circuit, 836: second readout circuit, 837: third readout circuit, 8351: fourth capacitor, 8353: magnetic flux modulation signal line, 9111: first electrode, 9112: second electrode, 9113: third electrode, 9114: fourth electrode, 9121: first Josephson junction, 921: fourth capacitive plate, 922: third squid, 9211: first portion, 9212: second portion, 9213: third portion, 9221: second Josephson junction

DESCRIPTION OF EMBODIMENTS

The following detailed description is merely illustrative and is not intended to limit embodiments and/or application or uses of embodiments. In addition, there is no intention to be bound by any expressed or implied information presented in the preceding Background or Summary sections, or in the Detailed Description section.

To make objectives, technical solutions, and advantages of embodiments of the present disclosure clearer, one or more embodiments are now described with reference to the accompanying drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details. The embodiments may be combined with each other and mutually referenced without contradiction.

It should be noted that the terms "first", "second", and the like, in the specification and claims of the present disclosure and in the foregoing drawings are used for distinguishing similar objects and not necessarily for describing a particular order or a sequential order. It should be understood that data thus used is interchangeable in proper circumstances, such that the embodiments of the present disclosure described herein can be implemented in orders except the orders illustrated or described herein. In addition, the terms "include" and "have" and any other variants thereof are intended to cover the non-exclusive inclusion. For example, a process, method, system, product, or device that includes a series of steps or units is not necessarily limited to those expressly listed steps or units, but may include other steps or units not expressly listed or inherent to such process, method, product, or device.

In addition, it should be understood that when a layer (or film), region, pattern, or structure is referred to as being "on" a substrate, layer (or film), region, and/or pattern, it may be directly on another layer or substrate, and/or there may be an insertion layer. In addition, it should be understood that when a layer is referred to as being "under" another layer, it may be directly under another layer, and/or there may be one or more insertion layers. In addition, for "on" a layer and "under" a layer, reference may be made to the drawings.

According to different physical systems used to construct a quantum bit, a qubit includes a superconducting quantum circuit, a semiconductor quantum dot, an ion trap, a diamond vacancy, a topological quantum, a photon, and the like in a physical implementation.

The superconducting quantum circuit is currently the fastest and best way to implement solid-state quantum computing. Since an energy level structure of the superconducting quantum circuit may be controlled by an external electromagnetic signal, design and customization of the circuit are highly controllable. At the same time, thanks to an existing mature integrated circuit process, quantum chips and quantum computing based on superconducting quantum circuits have scalability that is unmatched by most quantum physics systems. In some embodiments of the present disclosure, a quantum circuit may also be called a quantum computing circuit.

FIG. 1A is a schematic diagram of a quantum circuit in the related art.

Referring to FIG. 1A, currently, in a common quantum computing circuit, a qubit circuit generally has a circuit structure including a capacitor $C_q$ with one end grounded and a squid connected in parallel with the capacitor $C_q$. The capacitor $C_q$ affects anharmonicity of a qubit. During the design of the quantum circuit, once anharmonic parameters of the qubit are determined, the capacitor $C_q$ is determined. Since each element may occupy a certain space, it is spatially limited to some extent to design and lay out the quantum circuit only by using this circuit structure, and it is impossible to reserve enough space for other circuit structures or elements, thereby affecting design and layout of the other circuit structures.

Figure 1B:
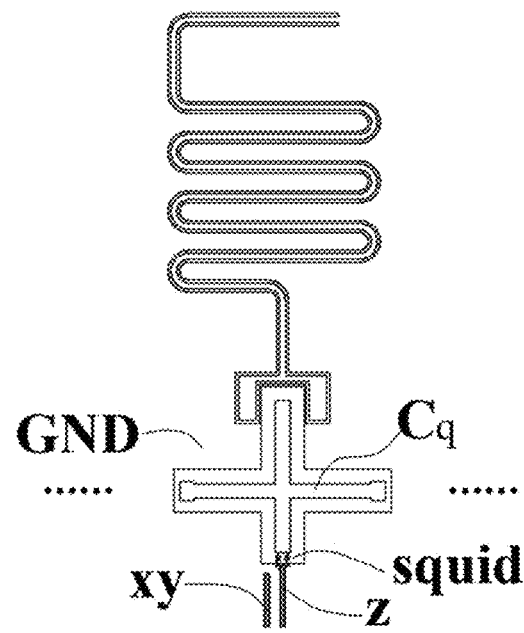
FIG. 1B is a schematic structural diagram of qubits on a quantum chip in the related art.

Based on the above quantum computing circuit, in terms of an implementation structure of the qubit, the capacitor $C_q$ in the structure of the qubit is generally a cross-shaped parallel plate capacitor. Referring to FIG. 1B, a cross-shaped capacitive plate $C_q$ is surrounded by a ground plane (GND), and there is a gap between the cross-shaped capacitive plate $C_q$ and the ground plane (GND). The squid has one end connected to the cross-shaped capacitive plate $C_q$ and the other end connected to the ground plane (GND). Since the cross-shaped capacitive plate $C_q$ has a first end generally configured to connect the squid and a second end configured to be coupled to a read resonant cavity, a certain space is required to be reserved near the first end and the second end for wiring. For example, spaces for laying out an xy signal line and a z signal line are required to be reserved near the first end. The other two ends of the cross-shaped capacitive plate $C_q$ are configured to be coupled to adjacent qubits. The qubit with this structure facilitates one-dimensional chain arrangement. However, when qubits are arranged in a one-dimensional chain on a quantum chip, each qubit is only coupled to two qubits adjacent to the qubit on the left and right, connectivity between the qubits is not good, and this structure has certain limitations.

To this end, some embodiments of the present disclosure provide a quantum circuit, a quantum chip, and a quantum computer, to solve the deficiencies in the related art. In the quantum circuit provided in some embodiments of the present disclosure, the qubit has a structure in which one end of a first capacitor and one end of a second capacitor are grounded, parallel-connected ends of a first squid and a third capacitor are connected to the other end of the first capacitor, and other parallel-connected ends of the first squid and the third capacitor are connected to the other end of the second capacitor. In this structure, combination of capacitors of the qubit is relatively flexible, and when anharmonic parameters of a qubit energy level system are determined, parameters of at least one of the plurality of capacitors in the qubit may be adjusted as required. Compared with the structural form of the quantum circuit in the related art, the solution provided in some embodiments of the present disclosure can prevent the space limitations existing in the quantum circuit of the related art and facilitate design and layout of other circuit structures. In some embodiments provided in the present disclosure, to emphasize a circuit implementation structure of the qubit, the qubit is also called a qubit circuit.

Figure 2:
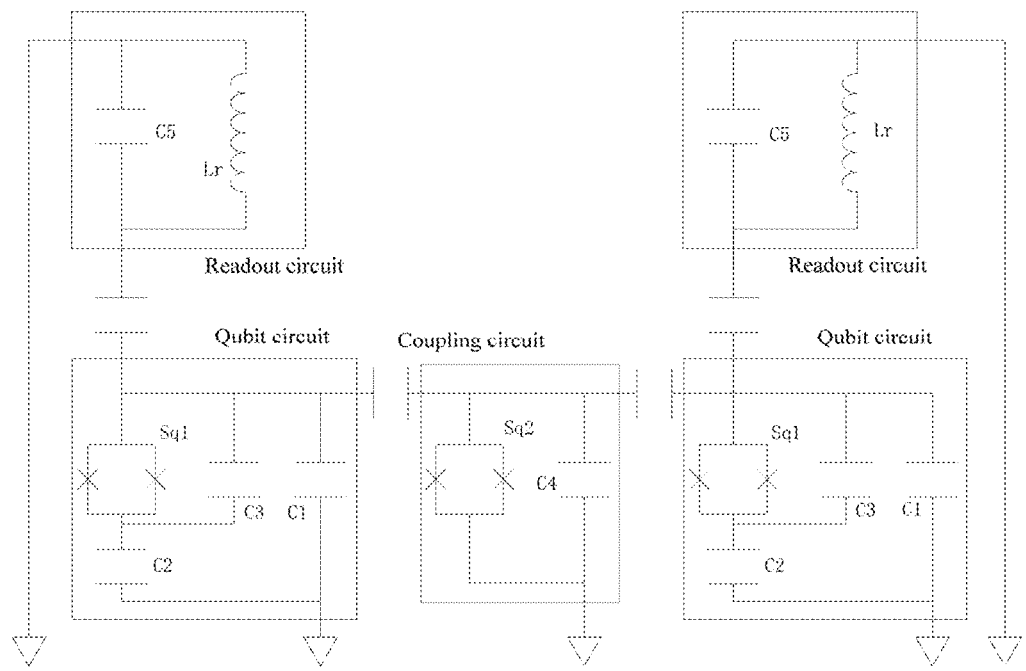
FIG. 2 is a schematic structural diagram of a quantum circuit according to some embodiments of the present disclosure.

Further, some embodiments of the present disclosure further provide an implementation structure of a qubit based on the above qubit circuit. Referring to FIG. 2, FIG. 2 is a schematic diagram of a quantum computing circuit according to some embodiments of the present disclosure. Some embodiments of the present disclosure provide a quantum computing circuit, including a plurality of qubit circuits.

Adjacent qubits are coupled, and the adjacent qubits may be coupled by capacitive coupling or resonant circuit coupling. The qubit circuit includes:

a first capacitor $C_1$, a first end of the first capacitor $C_1$ being grounded;

a second capacitor $C_2$, a first end of the second capacitor $C_2$ and the first end of the first capacitor $C_1$ being commonly grounded; and a first device, including a first squid Sq1 and a third capacitor $C_3$ that are connected in parallel, wherein parallel-connected first ends of the first squid Sq1 and the third capacitor $C_3$ are connected to a second end of the first capacitor $C_1$, and parallel-connected second ends of the first squid and the third capacitor $C_3$ are connected to a second end of the second capacitor $C_2$.

In the quantum computing circuit provided in some embodiments of the present disclosure, the qubit includes a plurality of capacitors, and anharmonicity of a qubit energy level system is affected by the plurality of capacitors. Compared with the quantum computing circuit in the related art, in the qubit circuit of the present disclosure, selection and combination of capacitors is relatively flexible, and when anharmonic parameters of the qubit energy level system are determined, parameters of at least one of the plurality of capacitors in the qubit circuit may be adjusted as required. For example, capacitor parameters are adjusted. The quantum computing circuit provided in some embodiments of the present disclosure can reserve enough space for other circuit structures or elements, which prevents the space limitations caused when the qubit in the quantum computing circuit of the related art includes a capacitor with one end grounded and a squid connected in parallel with the capacitor, thereby facilitating design and layout of the other circuit structures.

Referring to FIG. 2 and FIG. 1A together, in a case where the anharmonic parameters of the qubit energy level system in some embodiments of the present disclose are the same as the anharmonic parameters of the qubit energy level system in FIG. 1A, the first capacitor $C_1$, the second capacitor $C_2$, and the third capacitor $C_3$ in some embodiments of the present disclose are only required to satisfy $$C_q = \frac{c_1 c_2}{c_1 + c_2} + C_3.$$

Compared with the structure of the qubit in FIG. 1A, the qubit in some embodiments of the present disclose includes a plurality of capacitors. During the design of the quantum chip, each capacitor may be designed and laid out according to an actual situation (for example, in consideration of factors such as a size of the read resonant cavity), as long as an equivalent capacitor composed of the first capacitor, the second capacitor $C_2$, and the third capacitor $C_3$ is equal to $C_q$. For example, a capacitance value $C_1$ of the first capacitor, a capacitance value $C_2$ of the second capacitor, and a capacitance value $C_3$ of the third capacitor satisfy: $C_1=C_2=2C_q$, and $$C_3 \leq \frac{c_2}{100}.$$

In this case, compared with the capacitor $C_q$ in FIG. 1A, a quantum computing circuit is constructed on a substrate (e.g., a dielectric substrate such as silicon or sapphire) based on the structure in some embodiments of the present disclosure, which can expand physical sizes of plates corresponding to the first capacitor $C_1$ and the second capacitor $C_2$, thereby reserving a larger space and facilitating design and layout of other circuit structures. In some embodiments provided in the present disclosure, the substrate is also referred to as a base.

The quantum computing circuit is constructed on a substrate (e.g., a dielectric substrate such as silicon or sapphire) based on the structure in some embodiments of the present disclosure. For example, based on the existing mature integrated circuit process, a first capacitive plate, a second capacitive plate, and the first squid are formed on the substrate, and the first capacitive plate and the second capacitive plate are not directly connected to the ground plane (GND), but have appropriate gaps with the ground plane (GND). Physical sizes of the gaps are designed and determined based on performance parameters of the quantum computing circuit. It is to be noted that the first capacitor $C_1$ is formed between the first capacitive plate and the ground plane (GND), the second capacitor $C_2$ is formed between the second capacitive plate and the ground plane (GND), and the third capacitor $C_3$ is formed between the first capacitive plate and the second capacitive plate. Values of the first capacitor $C_1$, the second capacitor $C_2$, and the third capacitor $C_3$ are calculated and determined based on the performance parameters of the quantum computing circuit, and then physical sizes of the first capacitive plate and the second capacitive plate are calculated and determined. The first squid is located between the first capacitive plate and the second capacitive plate, and the first squid has one end connected to the first capacitive plate and the other end connected to the second capacitive plate. The first capacitive plate, the second capacitive plate, and the first squid are surrounded by the ground plane (GND) and separated from the ground plane (GND) by a gap that exposes a surface of the substrate. A dielectric substrate such as silicon or sapphire may be used as the substrate. For example, the first capacitive plate, the second capacitive plate, the first squid, and the ground plane (GND) are formed on a silicon substrate. The first capacitive plate, the second capacitive plate, and the ground plane (GND) may be formed of a superconducting material that exhibits superconducting properties at a temperature equal to or lower than a critical temperature, such as aluminum, niobium or titanium nitride, and are not limited to such materials during specific implementation. Materials that exhibit superconducting properties at temperatures equal to or lower than the critical temperature may all be used to form the first capacitive plate, the second capacitive plate, and the ground plane (GND).

In some embodiments provided in the present disclosure, the first capacitor may alternatively be an equivalent capacitor composed of a plurality of capacitive elements connected in series or parallel, or partially connected in series and partially connected in parallel. Similarly, the second capacitor may alternatively be an equivalent capacitor composed of a plurality of capacitive elements connected in series or parallel, or partially connected in series and partially connected in parallel. A quantity and an electrical connection relationship of the capacitive elements may be determined as required.

In some embodiments, adjacent qubit circuits in the quantum computing circuit are connected by a frequency-tunable coupling circuit. The frequency-tunable coupling circuit facilitates the control over strength of the coupling between the adjacent qubit circuits and helps to implement execution of a double-quantum logic gate. For example, a qubit circuit q1 and a qubit circuit q2 are at adjacent positions, and the coupling circuit is coupled to the qubit circuit q1 and the qubit circuit q2 respectively, thereby generating an indirect coupling between the qubit circuit q1 and the qubit circuit q2. Moreover, by adjusting a frequency of the coupling circuit, strength of the coupling between the qubit circuit q1 and the qubit circuit q2 can be adjusted. For example, the coupling circuit includes a fourth capacitor $C_4$ having one end grounded, and a second squid Sq2 connected in parallel with the fourth capacitor $C_4$. In some examples, the second squid Sq2 includes at least two Josephson junctions, and the Josephson junctions are connected in parallel. The frequency of the coupling circuit can be adjusted by applying external magnetic flux. In some examples, in order to obtain the second squid Sq2 with an asymmetric structure to enable a spectrum of the coupling circuit to have at least two magnetic flux insensitive points, a number of the Josephson junctions in the second squid Sq2 is an odd number. Similarly, the first squid Sq1 is similar to the second squid and includes two Josephson junctions, and the Josephson junctions are connected in parallel. In order to obtain the first squid Sq1 with an asymmetric structure to enable a spectrum of the qubit circuit to have at least two magnetic flux insensitive points, a number of the Josephson junctions in the first squid Sq1 may also be an odd number.

By applying external magnetic flux to the qubit circuit q1 and the qubit circuit q2, the external magnetic flux directly affects Josephson energy of the qubit circuit, thereby changing the frequency of the qubit circuit. Therefore, the frequency of the qubit circuit can be easily adjusted by adjusting magnetic flux of the first squid Sq1. In the frequency-tunable coupling circuit, the frequency of the coupling structure can be changed by changing a magnetic field generated by currents flowing through the Josephson junctions in the second squid Sq2. Based on this, the indirect coupling between the qubit circuit q1 and the qubit circuit q2 at adjacent positions can be achieved, laying the foundation for realization of the double-quantum logic gate.

In some embodiments, the Josephson junctions are tunnel junctions, point contacts, or have other structures exhibiting a Josephson effect.

In some embodiments, the quantum computing circuit further includes a readout circuit, and the readout circuit is coupled to the qubit circuit. A quantum state of the qubit circuit after control is read by using the readout circuit. For example, the readout circuit includes a fifth capacitor $C_5$ having one end grounded, and an inductor connected in parallel with the fifth capacitor $C_5$. In some examples, the readout circuit is capacitively coupled to the qubit circuit. In some embodiments of the present disclosure, each qubit circuit includes the readout circuit coupled thereto, and other ends of a plurality of readout circuits are coupled to a common read signal transmission line. The read signal transmission line acquires quantum state information through the readout circuit corresponding to each qubit.

In the quantum computing circuit of the present disclosure, the qubit circuit includes a plurality of capacitors, and anharmonicity of a qubit energy level system is affected by the plurality of capacitors. Compared with the quantum computing circuit in the related art, in the qubit circuit of the present disclosure, selection and combination of capacitors is relatively flexible, and when anharmonic parameters of the qubit energy level system are determined, parameters of at least one of the plurality of capacitors may be adjusted as required. This structure prevents the space limitations caused when the qubit in the quantum computing circuit of the related art includes a capacitor with one end grounded and a squid connected in parallel with the capacitor. Therefore, the solution of the present disclosure facilitates design and layout of other circuit structures. For example, enough space is reserved to facilitate design and layout of the readout circuit and a control circuit (such as a magnetic flux control circuit or a pulse control circuit, not shown in the figure) of the qubit circuit.

The following is an exemplary description of a specific implementation structure of the above quantum circuit.

Figure 3:
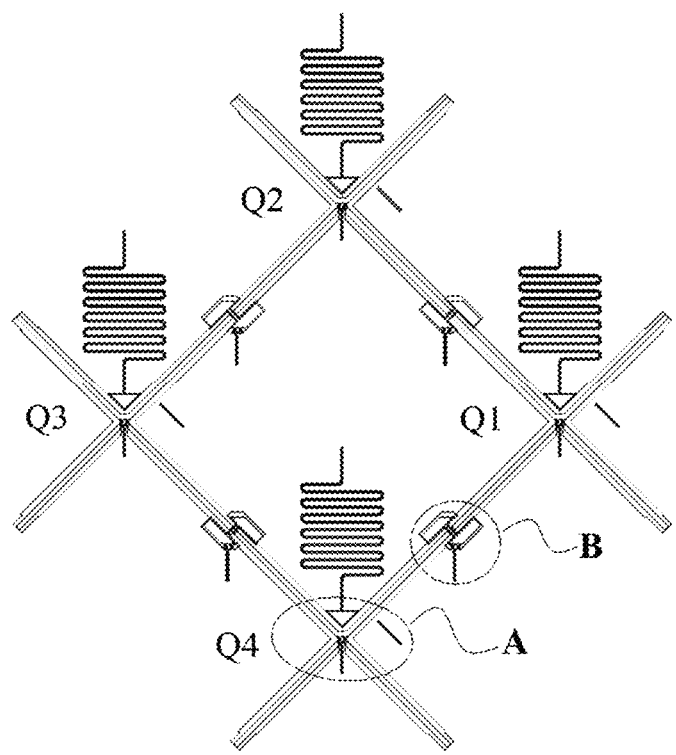
FIG. 3 is a schematic structural diagram of a quantum chip according to the present disclosure.
Figure 4:
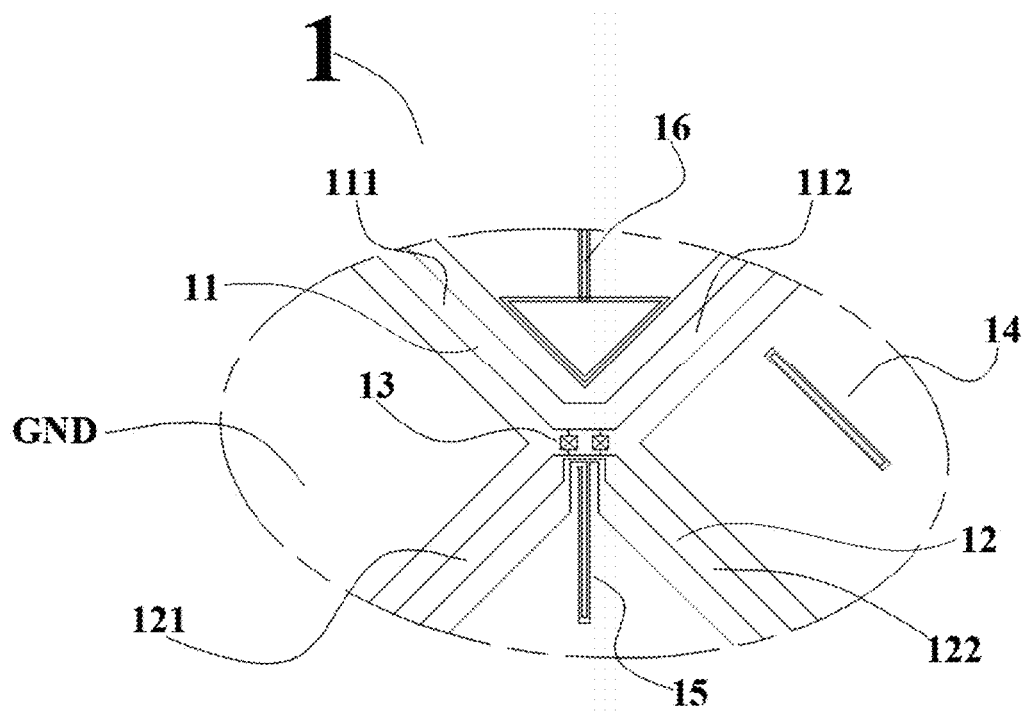
FIG. 4 is an enlarged schematic diagram of Region A in FIG. 3.
Figure 5:
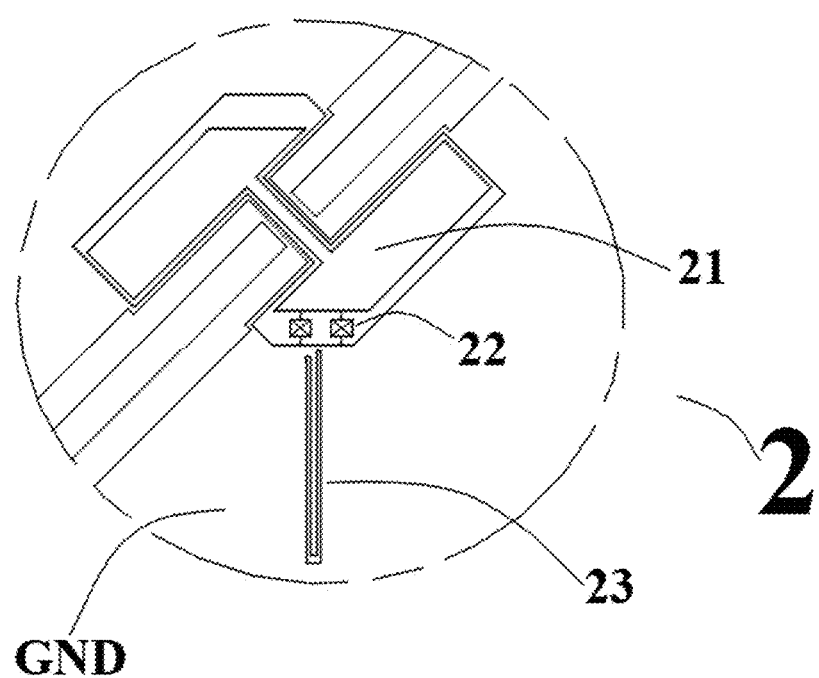
FIG. 5 is an enlarged schematic diagram of Region B in FIG. 3.

Referring to FIG. 3, FIG. 4, and FIG. 5, a quantum chip provided in some embodiments of the present disclosure includes:

a plurality of qubits 1. The plurality of qubits 1 are arranged in an array on a substrate. Each of the qubits 1 includes: a first capacitive plate 11, a second capacitive plate 12, and a first squid 13. The first squid 13 has one end connected to the first capacitive plate 11 and the other end connected to the second capacitive plate 12.

The first capacitive plate 11 includes a first arm 111 and a second arm 112 that intersect. The second capacitive plate 12 includes a third arm 121 and a fourth arm 122 that intersect. That is, in some embodiments of the present disclosure, the first arm 111 and the second arm 112 have a same end, and the third arm 121 and the fourth arm 122 have a same end. One of the first arm 111 and the second arm 112 of one of the qubits 1 arranged in the array is coupled to one of the third arm 121 and the fourth arm 122 of another qubit adjacent to the one of the qubits 1.

In some embodiments of the present disclosure, the qubit 1 on the quantum chip includes a first capacitive plate 11 having a first arm 111 and a second arm 112 that intersect, a second capacitive plate 12 having a third arm 121 and a fourth arm 122 that intersect, and a first squid 13 having one end connected to the first capacitive plate 11 and the other end connected to the second capacitive plate 12. The qubit 1 having this structure facilitates two-dimensional arrangement. Two of the qubits 1 at adjacent positions in a two-dimensionally arranged array form a coupling. That is, any qubit 1 is coupled to another qubit adjacent to the qubit 1 to realize communication, so as to realize expansion of the number of qubits on the substrate.

In addition, it is to be noted that, in some embodiments, the first squid 13 may have no direct physical contact with a ground plane (GND). Therefore, an operation on the ground plane (GND) during manufacturing and testing of the quantum chip can prevent damages to the first squid 13. Moreover, compared with a structure of a single ground capacitor, the first capacitive plate 11 and the second capacitive plate 12 that form a capacitor with the ground plane (GND) have larger physical sizes, and a space reserved for wiring on the substrate is larger in the two-dimensional arrangement, which can accommodate structures such as a read resonant cavity and a control signal line.

Referring to FIG. 3, in order to facilitate the description in some embodiments of the present disclosure, Q1, Q2, Q3 and Q4 are used to represent respective qubits 1 in basic units arranged in an array. Each qubit in the qubit Q1, the qubit Q2, the qubit Q3, and the qubit Q4 includes a first capacitive plate 11 and a second capacitive plate 12. The first capacitive plate 11 and the second capacitive plate 12 are not directly connected to the ground plane (GND), but have appropriate gaps with the ground plane (GND). Physical sizes of the gaps are designed and determined based on performance parameters of the quantum chip. It is to be noted that the above first capacitor $C_1$ is formed between the first capacitive plate 11 and the ground plane (GND), the above second capacitor $C_2$ is formed between the second capacitive plate 12 and the ground plane (GND), and the above third capacitor $C_3$ is formed between the first capacitive plate 11 and the second capacitive plate 12. Values of the capacitor $C_1$, the capacitor $C_2$, and the capacitor $C_3$ are calculated and determined based on the performance parameters of the quantum chip, and then physical sizes of the first capacitive plate 11 and the second capacitive plate 12 are calculated and determined. Physical sizes of the first arm 111 and the second arm 112, as well as the third arm 121 and the fourth arm 122 can be determined accordingly.

Referring to FIG. 3 and FIG. 1B together, in a case where the anharmonic parameters of the qubit energy level system in some embodiments of the present disclose are the same as the anharmonic parameters of the qubit energy level system in FIG. 1B, the capacitor $C_1$, the capacitor $C_2$, and the capacitor $C_3$ in some embodiments of the present disclose are only required to satisfy $$C_q = \frac{c_1 c_2}{c_1 + c_2} + C_3.$$

Compared with the structure of the qubit in FIG. 1B, the qubit in some embodiments of the present disclose includes a plurality of capacitors. During the design of the quantum chip, a value of each capacitor may be selected according to an actual situation (for example, in consideration of factors such as a size of the read resonant cavity). For example, when the capacitor $C_3$ is small, $C_1=C_2=2C_q$ is selected. Therefore, compared with the capacitive plate in FIG. 1B, the structure in some embodiments of the present disclosure can expand the physical sizes of the first capacitive plate and the second capacitive plate, so as to reserve a larger space for wiring.

In some embodiments, the first capacitive plate 11, the second capacitive plate 12, the first squid 13, and the ground plane (GND) are formed on the substrate, the qubit Q1, the qubit Q2, the qubit Q3, and the qubit Q4 arranged in an array may be surrounded by the ground plane (GND), and the first capacitive plate 11 and the second capacitive plate 12 may be separated from the ground plane (GND) by a gap that exposes a surface of the substrate. In some embodiments of the present disclosure, a dielectric substrate such as silicon or sapphire may be used as the substrate. In some embodiments of the present disclosure, the qubit Q1, the qubit Q2, the qubit Q3, the qubit Q4, and the ground plane (GND) are formed on a silicon substrate. The first capacitive plate 11, the second capacitive plate 12, and the ground plane (GND) may be formed of a superconducting material that exhibits superconducting properties at a temperature equal to or lower than a critical temperature, such as aluminum, niobium or titanium nitride, and are not limited to such materials during specific implementation. Materials that exhibit superconducting properties at temperatures equal to or lower than the critical temperature may all be used to form the first capacitive plate 11, the second capacitive plate 12, and the ground plane (GND).

In order to manufacture the quantum chip in some embodiments of the present disclosure, the qubits 1 arranged in the array on the substrate require a plurality of layers to form the first squid 13. In some embodiments, each first squid 13 includes two Josephson junctions connected in parallel. Each Josephson junction has a stacked structure of superconducting layer-insulating layer-superconducting layer. A first layer of superconducting material may be deposited to form a first superconducting layer of the Josephson junction, and then part of the first superconducting layer is oxidized to form an insulating layer. Then, a second layer of superconducting material may be deposited to form a second superconducting layer of the Josephson junction, so as to obtain the stacked structure of superconducting layer-insulating layer-superconducting layer. For example, in order to facilitate simultaneous manufacturing of a plurality of Josephson junctions on the quantum chip and reduce process difficulty, the Josephson junctions on the quantum chip all have a same directional structure. That is, extension directions of first superconducting layers, insulating layers, and second superconducting layers of the plurality of Josephson junctions are the same, and stacking orders of the first superconducting layers, the insulating layers, and the second superconducting layers of the plurality of Josephson junctions are also the same.

To maximize the space reserved on the substrate to meet a wiring requirement, in some embodiments of the present disclosure, the first squid 13 has one end connected to an intersection of the first arm 111 and the second arm 112 and the other end connected to an intersection of the third arm 121 and the fourth arm 122. Referring to FIG. 3, the end where the first arm 111 and the second arm 112 intersect is denoted as a first intersection end, and the end where the third arm 121 and the fourth arm 122 intersect is denoted as a second intersection end. Then, the first squid 13 is located between the first intersection end and the second intersection end. It is to be noted that the first arm 111 and the second arm 112 may be orthogonal or non-orthogonal, and the third arm 121 and the fourth arm 122 may be orthogonal or non-orthogonal.

In some embodiments of the present disclosure, basic units of the qubits 1 arranged in the array have a square shape or a rhombus shape, so that wiring can be performed in the basic units having the square shape or the rhombus shape, which may not be limited thereto in specific implementation.

In some embodiments of the present disclosure, a read resonant cavity 16 and a control signal line that are coupled to the qubit 1 are further formed on the substrate, and the control signal line includes a pulse modulation line 14 and a first magnetic flux modulation line 15. In the present disclosure, shapes of the basic units arranged in the array may be adjusted according to sizes of the read resonant cavity 16 and the control signal line, and the first arm 111 and the second arm 112 as well as the third arm 121 and the fourth arm 122 are orthogonal or non-orthogonal to obtain enough space for wiring.

In some embodiments of the present disclosure, the first squid 13 includes Josephson junctions connected in parallel, and the Josephson junctions are tunnel junctions, point contacts, or have other structures exhibiting a Josephson effect.

In some embodiments of the present disclosure, a coupling structure 2 is further formed between two adjacent qubits 1, which may correspond to, for example, the coupling circuit in the foregoing embodiments. The coupling structure 2 is coupled to one of the first arm 111 and the second arm 112 of one of the qubits 1, and is also coupled to one of the third arm 121 and the fourth arm 122 of another qubit adjacent to the one of the qubits. For example, referring to FIG. 3, FIG. 4, and FIG. 5, the coupling structure 2 is coupled to the second arm 112 of one of the qubits 1, and is also coupled to the third arm 121 of another qubit adjacent to the one of the qubits. The coupling structure 2 is coupled to two of the qubits 1 to achieve an indirect coupling between adjacent qubits 1.

In some embodiments, the coupling structure 2 may have structures such as capacitors and resonant cavities, or may have a frequency-tunable coupling structure. For example, the frequency-tunable coupling structure includes a third capacitive plate 21 and a second squid 22, and the second squid 22 has one end connected to the third capacitive plate 21 and the other end connected to the ground plane (GND). Therefore, a ground capacitor is formed between the third capacitive plate 21 and the ground plane (GND), which may correspond to, for example, the fourth capacitor $C\_4$ in the foregoing embodiments. The ground capacitor is connected in parallel with the second squid 22, and the second squid 22 has a superconducting ring structure composed of Josephson junctions. The use of the coupling structure 2 in this form facilitates the control over strength of the coupling between adjacent qubits 1 and facilitates execution of the double-quantum logic gate on the quantum chip.

In some embodiments, the superconducting ring structure includes at least three Josephson junctions. After two of the Josephson junctions are connected in parallel to form a ring structure, the ring structure is then connected in parallel with another Josephson junction. In some embodiments of the present disclosure, the frequency of the coupling structure can be changed by changing a magnetic field generated by currents flowing through the Josephson junctions. In this way, the indirect coupling between the adjacent qubits 1 arranged in the array is achieved. At the same time, it is also convenient to use the coupling structure to control strength of the coupling between the qubits, and the frequency of the coupling structure 2 can be adjusted by applying external magnetic flux. For example, magnetic flux of the second squid 22 may be adjusted through a second magnetic flux modulation line 23 to adjust the frequency of coupling structure 2.

Referring to FIG. 3, the coupling structure 2 is coupled to the qubit Q1 and the qubit Q4 respectively, thereby generating an indirect coupling between the qubit Q1 and the qubit Q4. Moreover, by adjusting the frequency of the coupling structure 2, strength of the coupling between the qubit Q1 and the qubit Q4 can be adjusted.

For example, the coupling structure 2 includes a second squid 22 and a capacitor connected in parallel with the second squid 22. For example, the coupling structure 2 includes a third capacitive plate 21 and a second squid 22, and the second squid 22 has one end connected to the third capacitive plate 21 and the other end connected to the ground plane (GND). Therefore, a ground capacitor is formed between the third capacitive plate 21 and the ground plane (GND), and the ground capacitor is connected in parallel with the second squid 22.

FIG. 6 is a flowchart of a manufacturing method for a quantum chip according to some embodiments of the present disclosure.

Referring to FIG. 6 together with FIG. 3, FIG. 4, and FIG. 5, some embodiments of the present disclosure further provide a manufacturing method for a quantum chip. The quantum chip includes a plurality of qubits, the plurality of qubits being arranged in an array. The manufacturing method includes the following steps.

In S501, a first capacitive plate and a second capacitive plate of each qubit are formed on a substrate, wherein the first capacitive plate includes a first arm and a second arm that intersect with each other, the second capacitive plate includes a third arm and a fourth arm that intersect with each other, and one of the first arm and the second arm of one of the qubits is coupled to one of the third arm and the fourth arm of a qubit adjacent to one of the qubits.

In S502, a squid is formed on the substrate, wherein the squid has one end connected to the first capacitive plate and the other end connected to the second capacitive plate.

The quantum chip may include structures such as bit units, a control circuit, and read resonant cavities. When the plurality of qubits are arranged in an array on the substrate of the quantum chip, basic units arranged in the array may form the bit units, and the qubits of one bit unit of the bit units on a same straight line may form a bit one-dimensional chain. Some embodiments of the present disclosure provide another quantum chip, and an implementation structure is illustrated in FIG. 7 to FIG. 10.

Figure 8:
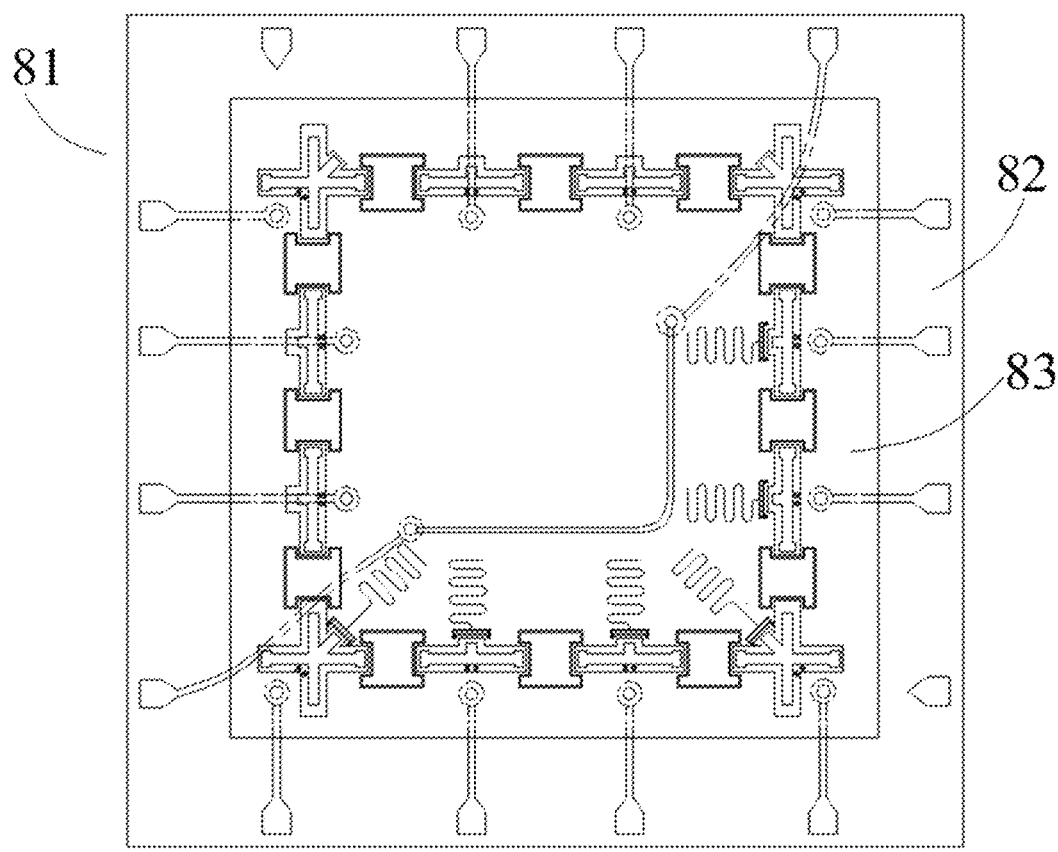
FIG. 8 is a schematic structural diagram of a superconducting quantum chip according to some embodiments of the present disclosure.

A superconducting quantum chip 81 in FIG. 8 includes a first chip 82 and a second chip 83 located on the first chip 82. In order to be distinguished from each other, parts of components on the first chip 82 that are covered and blocked by the second chip 83 in FIG. 7 are shown with dotted lines.

Figure 9:
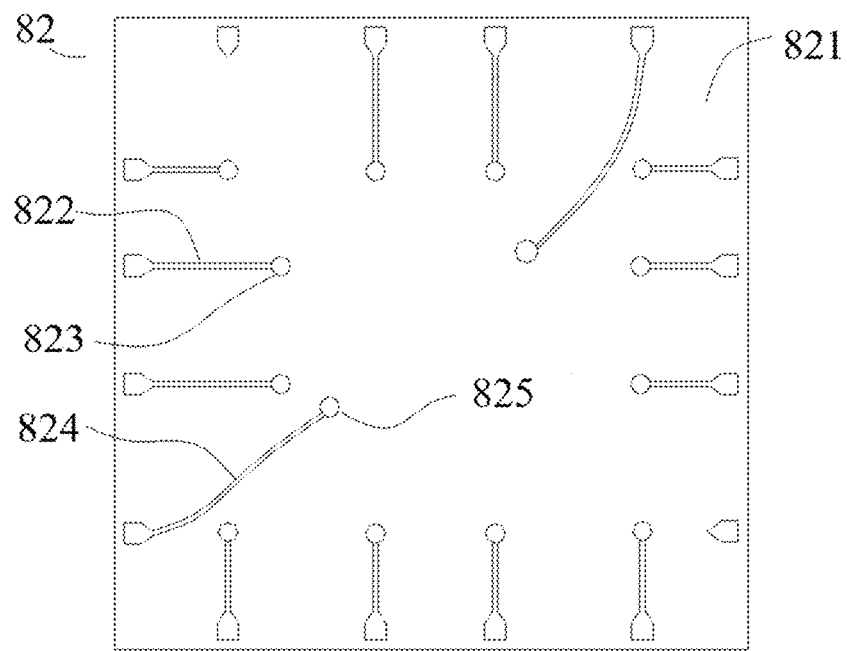
FIG. 9 is a schematic structural diagram of a first chip 82 in FIG. 8.
Figure 10:
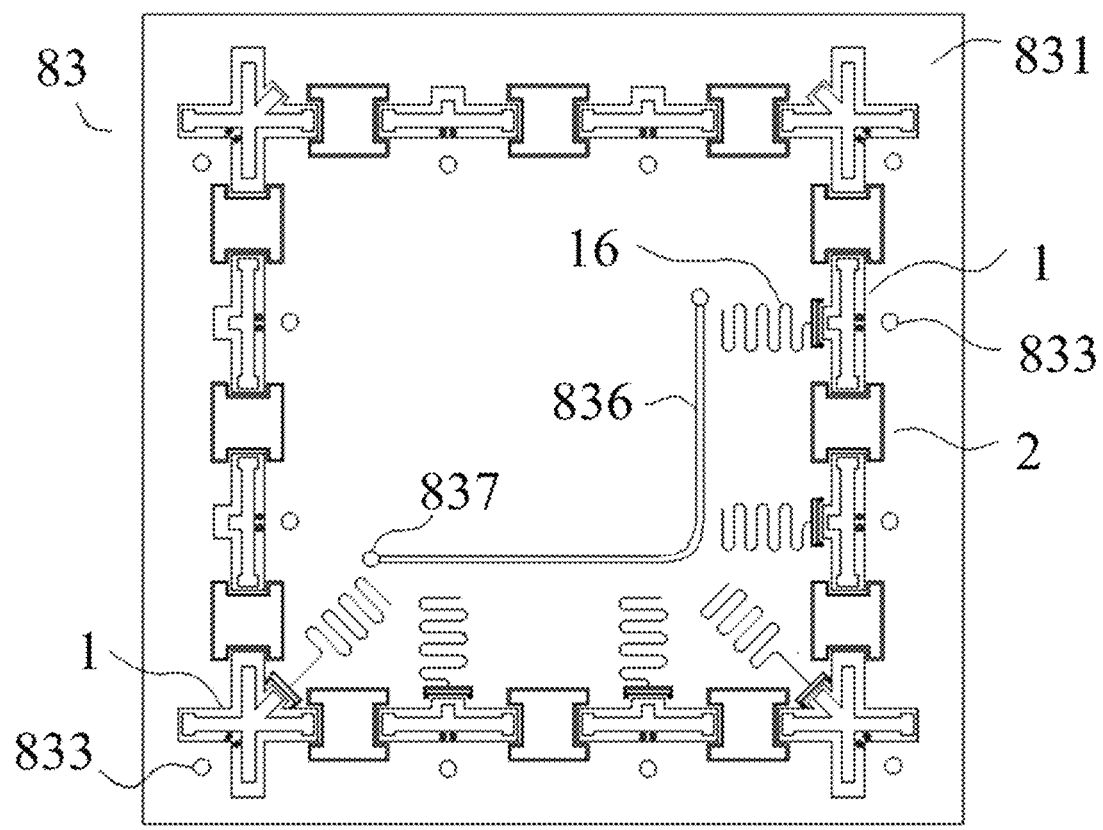
FIG. 10 is a schematic structural diagram of a second chip 83 in FIG. 8.

Referring to FIG. 7 together with FIG. 8, FIG. 9, and FIG. 10, some embodiments of the present disclosure provide a superconducting quantum chip 81, including bit units, a control circuit, and read resonant cavities 16.

The bit units include a plurality of bit one-dimensional chains sequentially coupled and connected end to end. For example, the bit units in the superconducting quantum chip 81 include a first bit one-dimensional chain 811, a second bit one-dimensional chain 812, a third bit one-dimensional chain 813, and a fourth bit one-dimensional chain 814. The first bit one-dimensional chain 811, the second bit one-dimensional chain 812, the third bit one-dimensional chain 813, and the fourth bit one-dimensional chain 814 are sequentially coupled and connected end to end to form a quadrilateral. The number of the bit one-dimensional chains is not limited thereto. In specific implementation, the number of the bit one-dimensional chains may alternatively be three, five, six, or the like.

Each of the bit one-dimensional chains includes at least three qubits 1, and adjacent qubits 1 are coupled. It may be understood that the bit one-dimensional chains are formed by arranging the qubits 1 along a one-dimensional direction, and a closed structure formed by sequentially coupling and connecting the plurality of one-dimensional bit chains end to end is the bit unit. The bit unit may be manufactured on a surface of the substrate by using the existing integrated circuit process. A dielectric substrate such as silicon or sapphire may be used as the substrate. The bit unit divides a surface of the substrate where the bit unit is located into an internal space and an external space. For example, the qubit 1 in FIG. 7 has a structure including a ground capacitor and a squid having one end grounded and the other end connected to the capacitor. In other embodiments provided in the present disclosure, the qubit 1 in FIG. 7 may alternatively have the qubit structure depicted in FIG. 2 to FIG. 6.

The read resonant cavities 16 are located in the internal space or external space of the bit unit, the control circuit is at least partially located in the internal space or external space of the bit unit, and the control circuit and the read resonant cavities 16 are both coupled to the qubits 1.

In this embodiment, the bit unit divides a surface of the substrate (a dielectric substrate such as silicon or sapphire) where the bit unit is located into an internal space C and an external space, and a size of the internal space C is relevant to the number of the qubits 1 included in the bit one-dimensional chain and/or physical sizes of the qubits. During design and manufacturing of the superconducting quantum chip, sizes of the internal space C and the external space may be adjusted according to layout requirements of the components (for example, the control circuit and the read resonant cavities 16), so that the read resonant cavities 16 are located in the internal space or the external space of the bit unit, the control circuit is at least partially located in the internal space or external space of the bit unit, and the control circuit and the read resonant cavities 16 are both coupled to the qubits 1.

Compared with the related art, in the superconducting quantum chip 81 provided in some embodiments of the present disclosure, sizes of the internal space and the external space of the bit unit can be adjusted according to the number and/or physical sizes of the qubits 1 included in the bit one-dimensional chain to facilitate design and layout of structures such as the read resonant cavity 16 and a measurement and control signal transmission line (such as a control circuit and a readout circuit), thereby solving the problem in the related art that it is difficult to have enough space to arrange structures such as the read resonant cavity 16 and the measurement and control signal transmission line in the case of integration and expansion of qubits, which helps to realize integration and expansion of a large number of qubits on the substrate. For example, the sizes of the internal space and the external space of the bit unit may be adjusted by adjusting an extension length of the capacitor in the qubit 1 between adjacent qubits 1. The extension length is a physical size of the capacitor along a one-dimensional direction of the arrangement of the qubits 1 in the bit one-dimensional chain, and an extension width is a physical size of the capacitor perpendicular to the one-dimensional direction of the arrangement of the qubits 1 in the bit one-dimensional chain. It may be understood that, in order to obtain a certain internal space and external space, a ratio of the extension length to the extension width may be limited. For example, the ratio of the extension length to the extension width is 5:1 or greater, so as to reserve a larger space. For example, a read resonant cavity 16 and a control circuit coupled to the qubit 1 are formed in the internal space or the external space.

In some embodiments of the present disclosure, the read resonant cavities 16 respectively coupled and connected to the qubits 1 in a same bit one-dimensional chain are distributed on a same side of the same bit one-dimensional chain. That is, the read resonant cavities 16 respectively corresponding to the plurality of qubits 1 in each bit one-dimensional chain are distributed on a same side of the bit one-dimensional chain. For example, referring to FIG. 7 and FIG. 8, the read resonant cavities 16 respectively corresponding to the three qubits 1 in the second bit one-dimensional chain are all arranged above the second one-dimensional chain. It may be understood that the read resonant cavities 16 distributed on a same side may share a readout circuit to save space and facilitate wiring. In some other embodiments of the present disclosure, to enable all the read resonant cavities 16 in a same bit unit to share a readout circuit, the read resonant cavities 16 are all located in the internal space.

In some embodiments of the present disclosure, the plurality of bit one-dimensional chains sequentially coupled and connected in the bit unit form a quadrilateral, a pentagon, or a hexagon. In specific implementation, the quadrilateral, pentagonal or hexagonal bit unit may be used as a basic unit to be arrayed on the surface of the substrate (such as silicon or sapphire) to achieve integration and expansion of a large number of qubits on the substrate.

In some embodiments of the present disclosure, the control circuit includes a first part and a second part, the first part is a first control circuit 822 located on a first base 821, the second part is a second control circuit 833 located on a second base 831, and the bit unit and the read resonant cavity 16 are also located on the second base 831. Dielectric substrates such as silicon or sapphire may be used as both the first base 821 and the second base 831, the second control circuit 833 is coupled to the qubit 1, and the first control circuit 822 is electrically connected to the second control circuit 833. For example, the first control circuit 822 is electrically connected to a control connecting portion 823 located on the first base 821. The control connecting portion 823 may have a structure such as a pad or a solder joint. The second control circuit 833 is electrically connected to the control connecting portion 823, which realizes the electrical connection between the first control circuit 822 and the second control circuit 833. In some embodiments provided in the present disclosure, the superconducting quantum chip 81 includes a first chip 82 and a second chip 83, so that components concentrated on one substrate in the related art are separated and arranged on the first base 821 and the second base 831 respectively.

In some embodiments of the present disclosure, a through-hole is formed in the first base 821. For example, the through-hole is a through-silicon via formed on the silicon substrate by using a Through-Silicon Via (TSV) process, and the second part of the control circuit (see the second control circuit 833 in FIG. 9) is located in the through-hole. For example, the second part of the control circuit may be formed by filling the through-hole with a superconducting dielectric material by using a 3D printing filling process or other processes.

In some embodiments of the present disclosure, the readout circuit includes a first readout circuit 824, a second readout circuit 836, and a third readout circuit 837. The first readout circuit 824 is formed on a surface of the first base 821, the second readout circuit 836 is formed on a surface of the second base 831, and the second readout circuit 836 is coupled to the corresponding read resonant cavity 16. A second through-hole is further formed in the second base 831, the third readout circuit 837 is located in the second through-hole, and the first readout circuit 824 and the second readout circuit 836 are electrically connected through the third readout circuit 837. For example, the first readout circuit 824 is electrically connected to a read connecting portion 825 located on the first base 821. The read connecting portion 825 may have a structure such as a pad or a solder joint. During metallization in the second through-hole, the third readout circuit 837 electrically connected to the read connecting portion 825 is manufactured, thereby realizing electrical connection among the first readout circuit 824, the second readout circuit 836, and the third readout circuit 837. For example, the third readout circuit 837 may be formed by filling the second through-hole with a superconducting dielectric material by using a 3D printing filling process or other processes.

Figure 11:
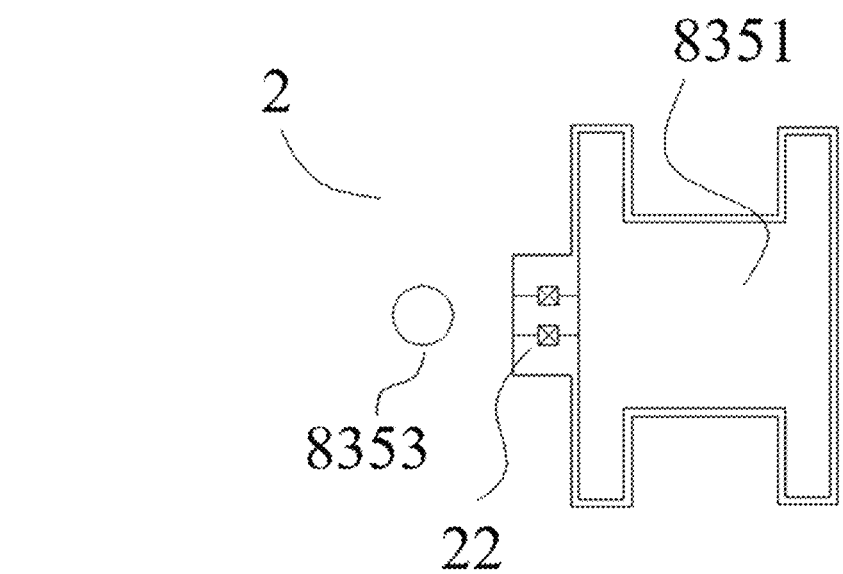
FIG. 11 is a schematic structural diagram of a frequency-tunable coupling structure 2 according to some embodiments of the present disclosure.
Figure 12:
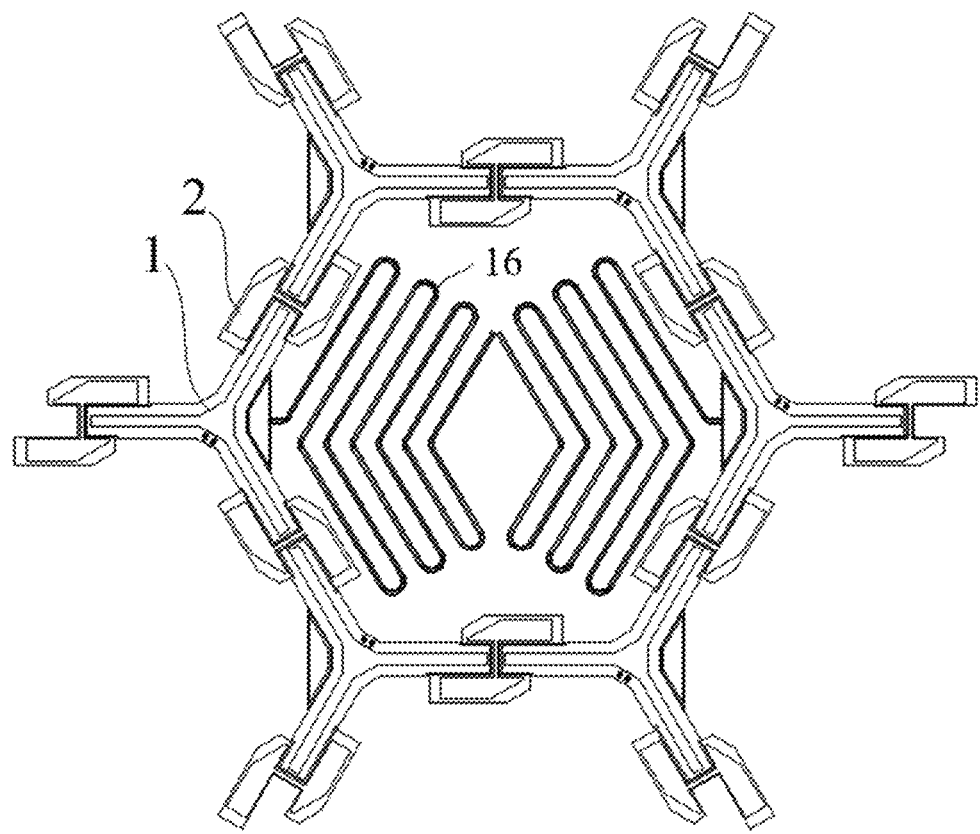
FIG. 12 is a schematic structural diagram of a quantum chip according to some embodiments of the present disclosure.
Figure 13:
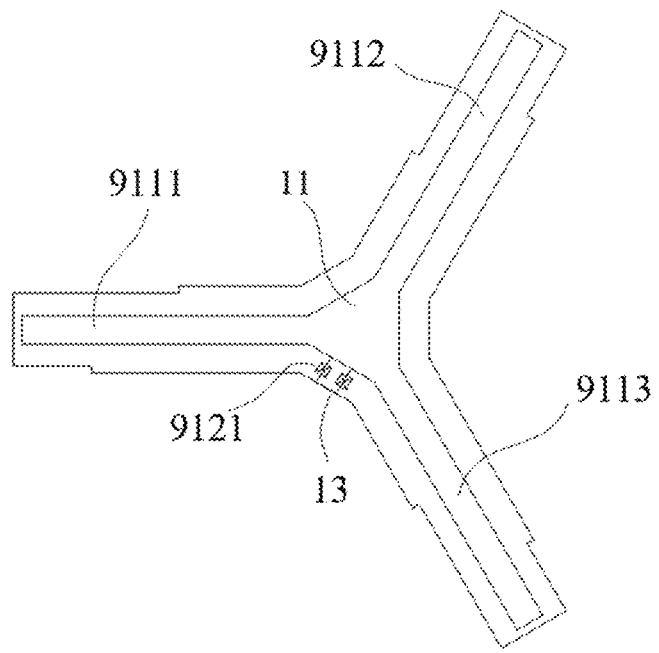
FIG. 13 is a schematic structural diagram of a qubit according to some embodiments of the present disclosure.
Figure 14:
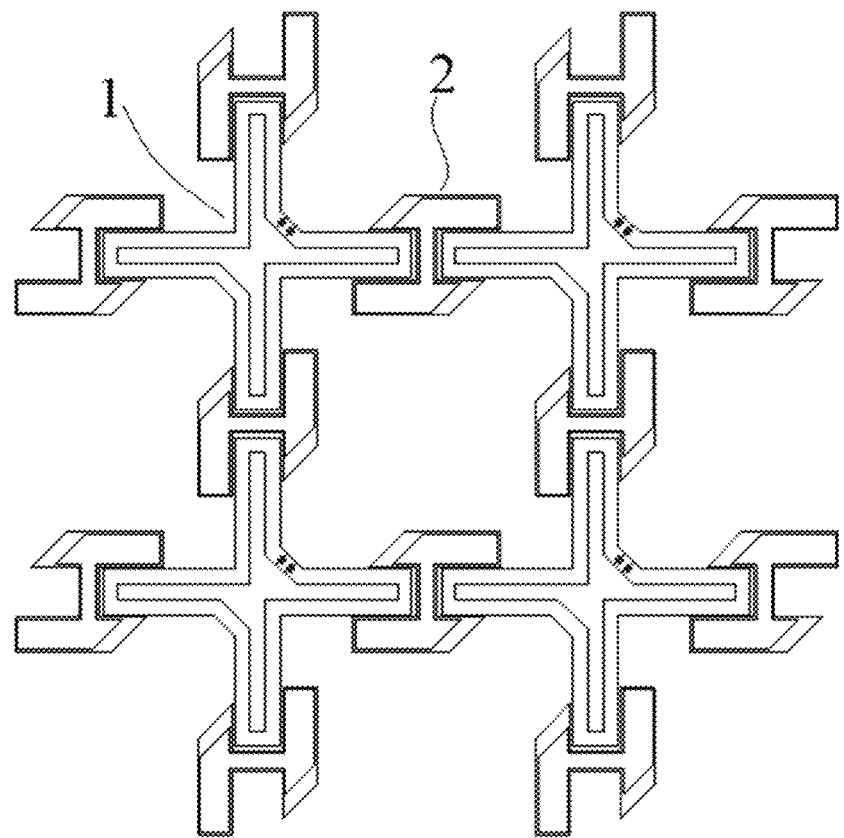
FIG. 14 is a schematic structural diagram of another quantum chip according to some embodiments of the present disclosure.
Figure 15:
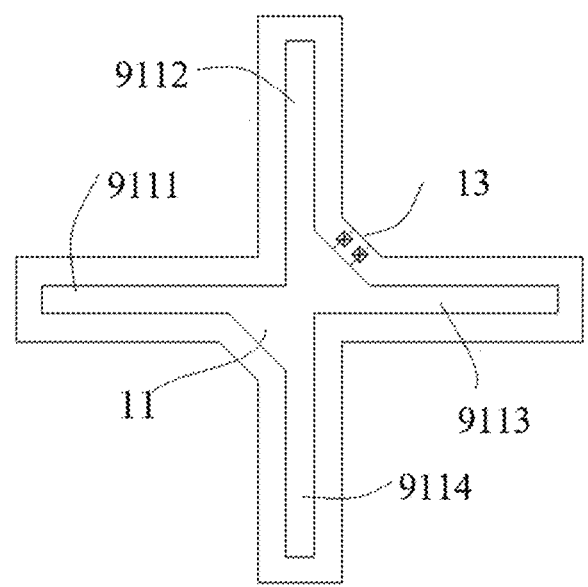
FIG. 15 is a schematic structural diagram of another qubit according to some embodiments of the present disclosure.
Figure 16:
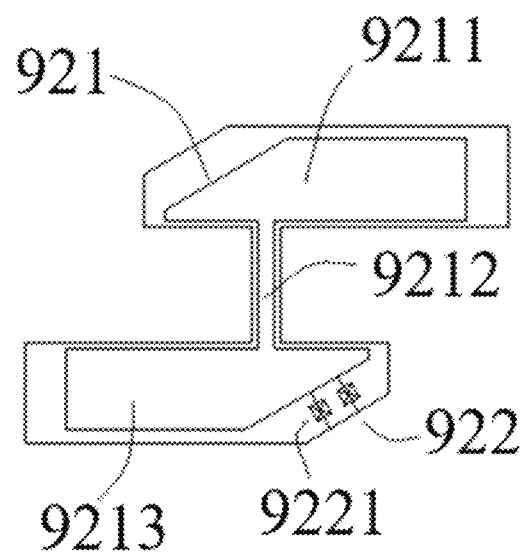
FIG. 16 is a schematic diagram of a coupling structure according to some embodiments of the present disclosure.

In some embodiments provided in the present disclosure, a coupling structure 2 is further formed between two adjacent qubits 1, which may correspond to, for example, the coupling circuit in the foregoing embodiments. The coupling structure 2 is coupled to the two adjacent qubits 1 to realize the coupling between the two qubits 1. The coupling structure 2 may have a structure with a fixed frequency such as a capacitor or a resonant cavity, or a structure with a tunable frequency. FIG. 11 is a schematic structural diagram of a frequency-tunable coupling structure 2 according to some embodiments of the present disclosure. Adjacent qubits 1 are connected by the frequency-tunable coupling structure 2. The frequency-tunable coupling structure 2 facilitates the control over strength of the coupling between the adjacent qubit circuits 1 and helps to implement execution of a double-quantum logic gate. For example, the two qubits 1 at adjacent positions are denoted as a qubit q1 and a qubit q2 respectively, the coupling structure 2 is coupled to the qubit q1 and the qubit q2 respectively, thereby generating an indirect coupling between the qubit q1 and the qubit q2. Moreover, by adjusting the frequency of the coupling structure 2, strength of the coupling between the qubit q1 and the qubit q2 can be adjusted.

In some embodiments of the present disclosure, as an example of the frequency-tunable coupling structure 2, the coupling structure 2 includes a grounded fourth capacitor 8351, a second squid 22, and a magnetic flux modulation signal line 8353 connected in parallel with the fourth capacitor. In some embodiments, the second squid 22 includes Josephson junctions connected in parallel. In some examples, the second squid 22 includes at least two Josephson junctions, and the Josephson junctions are connected in parallel. The frequency of the coupling structure 2 can be adjusted by applying external magnetic flux through the magnetic flux modulation signal line 8353. In some examples, in order to obtain the second squid 22 with an asymmetric structure to enable a spectrum of the coupling structure 2 to have at least two magnetic flux insensitive points, a number of the Josephson junctions in the second squid 22 is an odd number. The Josephson junctions are tunnel junctions, point contacts, or have other structures exhibiting a Josephson effect.

Similarly, the qubit 1 (e.g., the qubit q1 and the qubit q2) includes a capacitor with one end grounded and a first squid connected in parallel with the capacitor. The first squid includes at least two Josephson junctions, and the Josephson junctions are connected in parallel. It is to be noted that the first squid in the qubit 1 has a same structure as the second squid 22 in the frequency-tunable coupling structure 2. To facilitate the description of the embodiments, the present disclosure distinguishes the two in name. In order to obtain the first squid with an asymmetric structure in the qubit 1 so that a spectrum of the qubit 1 has at least two magnetic flux insensitive points, a number of the Josephson junctions in the first squid is also an odd number. By applying external magnetic flux to the qubit q1 and the qubit q2, the external magnetic flux directly affects Josephson energy of the qubit, thereby changing the frequency of the qubit. Therefore, the frequency of the qubit can be easily adjusted by adjusting magnetic flux of the first squid. In the frequency-tunable coupling structure 2, the frequency of the coupling structure 2 can be changed by changing a magnetic field generated by currents flowing through the Josephson junctions in the second squid 22. Based on this, the indirect coupling between the qubit q1 and the qubit q2 at adjacent positions can be achieved, laying the foundation for realization of the double-quantum logic gate.

In another quantum circuit provided in some embodiments of the present disclosure, the quantum circuit includes qubits, adjacent qubits being coupled, and each of the qubits including:
  a first capacitor, a first end of the first capacitor being grounded; and
  a first device, including a first squid; wherein a first end of the first squid is connected to a second end of the first capacitor, and a second end of the first squid is grounded.

In some embodiments, the above first capacitor may include a first capacitive plate. In this case, the first end of the first squid is connected to the first capacitive plate.

In some embodiments, the first capacitive plate may include a plurality of electrodes having a same intersection, and the qubits at adjacent positions form a coupled connection through one of the plurality of electrodes.

The above quantum circuit provided in some embodiments of the present disclosure may also solve the deficiencies in the related art, the qubit structure thereof facilitates array arrangement of the qubits, and the qubits at adjacent positions in the array arrangement of the qubits may form couplings. That is, any qubit may be coupled to a plurality of adjacent qubits to realize communication, thereby expanding the number of qubits.

The following is an example of a structure of a quantum chip implemented based on the above quantum circuit. Referring to FIG. 12 to FIG. 16, the structure of the quantum chip implemented based on the above quantum circuit provided in some embodiments of the present disclosure may include:
  a plurality of qubits 1. The qubit 1 includes a first capacitive plate 11 grounded, and a first squid 13 having one end connected to the first capacitive plate 11 and the other end connected to the ground.

The first capacitive plate 11 includes a plurality of electrodes having a same intersection, and the qubits 1 at adjacent positions form a coupled connection through one of the plurality of electrodes.

In some embodiments provided in the present disclosure, the ground may be a ground plane (GND) formed on the substrate, the qubit 1 is an electrical structure formed on a substrate, and the first capacitive plate 11 includes a plurality of electrodes. For example, the first capacitive plate 11 includes at least 3 electrodes having a same intersection. According to the structure in the present disclosure, the number of electrodes that the first capacitive plate 11 has is expanded, so that the number of qubits in which one qubit 1 establishes a coupled connection through the electrodes of the first capacitive plate 11 increases, thereby improving connectivity between the qubits on the quantum chip.

In some embodiments of the present disclosure, one end of the first squid 13 is connected to the intersection.

In some embodiments of the present disclosure, the plurality of electrodes have a same shape and structure. That is, physical structures of the plurality of electrodes are the same. For example, thicknesses and critical sizes of the electrodes on the substrate are the same.

In some embodiments of the present disclosure, the first capacitive plate 11 includes a first electrode 9111, a second electrode 9112, and a third electrode 9113 having a same intersection, or the first capacitive plate 11 includes a first electrode 9111, a second electrode 9112, a third electrode 9113, and a fourth electrode 9114 having a same intersection. It may be understood that "having a same intersection" means that the plurality of electrodes of the first capacitive plate 11 converge at a same position.

In some embodiments of the present disclosure, the first squid 13 includes Josephson junctions connected in parallel. For example, each first squid 13 includes two Josephson junctions 9121, and the Josephson junctions 9121 may be tunnel junctions, point contacts, or have other structures exhibiting a Josephson effect.

In some embodiments of the present disclosure, a coupling structure 2 is further formed between two adjacent qubits 1, and the coupling structure 2 is coupled to one of the electrodes of one of the qubits 1, and is also coupled to one of the electrodes of another qubit that is adjacent to the one of the qubits 1. For example, the coupling structure 2 may have structures such as capacitors and resonant cavities, or may have a frequency-tunable coupling structure. For example, referring to FIG. 16, the frequency-tunable coupling structure includes a fourth capacitive plate 921 and a third squid 922, and the third squid 922 has one end connected to the fourth capacitive plate 921 and the other end connected to the ground plane (GND). Therefore, a ground capacitor is formed between the fourth capacitive plate 921 and the ground plane (GND). The ground capacitor is connected in parallel with the third squid 922, and the third squid 922 has a superconducting ring structure composed of Josephson junctions. For example, the third squid 922 includes two second Josephson junctions 9221 connected in parallel. The use of the coupling structure 2 in this form facilitates the control over strength of the coupling between adjacent qubits 1 and facilitates execution of the double-quantum logic gate on the quantum chip. In some embodiments, the superconducting ring structure includes at least three second Josephson junctions 9221. After two of the Josephson junctions are connected in parallel to form a ring structure, the ring structure is then connected in parallel with another Josephson junction.

In some embodiments of the present disclosure, the frequency of the coupling structure 2 can be changed by changing a magnetic field generated by currents flowing through the Josephson junctions. In this way, an indirect coupling between adjacent qubits 1 arranged in the array is achieved. At the same time, it is also convenient to use the coupling structure 2 to control strength of the coupling between the qubits 1, and the frequency of the coupling structure 2 can be adjusted by applying external magnetic flux. For example, magnetic flux of the third squid 922 may be adjusted through a magnetic flux modulation line coupled to the third squid 922 to adjust the frequency of the coupling structure 2. That is, in some embodiments of the present disclosure, the coupling structure 2 includes a fourth capacitive plate 921 grounded, a third squid 922 having one end connected to the fourth capacitive plate 921 and the other end connected to the ground, and a magnetic flux modulation line coupled to the third squid 922.

In some embodiments of the present disclosure, the fourth capacitive plate 921 includes a first portion 9211 and a second portion 9212, and a third portion 9213 connecting the first portion 9211 and the second portion 9212, and one of the electrodes of one of the qubits and one of the electrodes of another qubit that is adjacent to the one of the qubits are respectively located on two sides of the third portion 9213 and both located between the first portion 9211 and the second portion 9212. For example, one of the first electrode 9111, the second electrode 9112 and the third electrode 9113 of one of the qubits 1 and one of the first electrode 9111, the second electrode 9112 and the third electrode 9113 of another qubit that is adjacent to the one of the qubits 1 are respectively located on two sides of the third portion 9213 and both located between the first portion 9211 and the second portion 9212.

Based on the quantum chip provided in some embodiments of the present disclosure, the first capacitive plate 11, the fourth capacitive plate 921, the first squid 13, the third squid 922, and the ground plane (GND) may be formed on the substrate, the qubits arranged in an array may be surrounded by the ground plane (GND), and the first capacitive plate 11 and the fourth capacitive plate 921 may be separated from the ground plane (GND) by a gap that exposes a surface of the substrate. In some embodiments of the present disclosure, a dielectric substrate such as silicon or sapphire may be used as the substrate. In some embodiments of the present disclosure, the qubit 1, the coupling structure 2, and the ground plane (GND) are formed on a silicon substrate. The first capacitive plate 11, the fourth capacitive plate 921, and the ground plane (GND) may be formed of a superconducting material that exhibits superconducting properties at a temperature equal to or lower than a critical temperature, such as aluminum, niobium or titanium nitride, and are not limited to such materials during specific implementation. Materials that exhibit superconducting properties at temperatures equal to or lower than the critical temperature may all be used to form the first capacitive plate 11, the fourth capacitive plate 921, and the ground plane (GND).

In order to manufacture the quantum chip in some embodiments of the present disclosure, the qubits 1 arranged in the array on the substrate require a plurality of layers to form the first squid 13 and the third squid 922. In some embodiments, each first squid 13 and each third squid 922 include two Josephson junctions connected in parallel. Each Josephson junction has a stacked structure of superconducting layer-insulating layer-superconducting layer. A manufacturing process and precautions for the Josephson junctions of the stacked structure are the same as those in other embodiments of the present disclosure. Details are not described herein again.

To maximize the space reserved on the substrate to meet a wiring requirement, in some embodiments of the present disclosure, the first squid 13 has one end connected to an intersection of the plurality of electrodes of the first capacitive plate 11 and the other end connected to the ground plane (GND).

In some embodiments of the present disclosure, a read resonant cavity 16 and a control signal line that are coupled to the qubit 1 are further formed on the substrate, and the control signal line includes a pulse modulation line and a first magnetic flux modulation line. In the present disclosure, shapes of the basic units arranged in the array as well as a number and a physical size of the electrodes of the first capacitive plate 11 may be adjusted according to sizes of the read resonant cavity 16 and the control signal line.

Some embodiments of the present disclosure further provide a manufacturing method for a quantum chip. The quantum chip includes a plurality of qubits. The manufacturing method includes:

forming a first capacitive plate 11 of each qubit 1 on the substrate, wherein the first capacitive plate 11 includes a plurality of electrodes having a same intersection. In this embodiment, the first capacitive plate 11 includes at least 3 electrodes having a same intersection, and the qubits 1 at adjacent positions form a coupled connection through one of the plurality of electrodes; and forming a first squid 13 on the substrate, wherein the squid 912 has one end connected to the first capacitive plate 11 and the other end connected to the ground. For example, one end of the first squid 13 is connected to the intersection. For example, the first capacitive plate 11 includes a first electrode 9111, a second electrode 9112, and a third electrode 9113 having a same intersection, or includes a first electrode 9111, a second electrode 9112, a third electrode 9113, and a fourth electrode 9114 having a same intersection, and the electrodes have a same shape and structure.

Some embodiments of the present disclosure further provide a quantum chip. The quantum chip is provided with at least the quantum circuit as described above.

Some embodiments of the present disclosure further provide a quantum computer. The quantum computer is provided with at least the quantum circuit as described above.

Some embodiments of the present disclosure further provide a quantum computer. The quantum computer is provided with at least the quantum chip as described above.

Some embodiments of the present disclosure further provide a quantum computer. The quantum computer is provided with at least the quantum chip manufactured with the manufacturing method in some embodiments of the present disclosure.

The quantum computer provided in some embodiments of the present disclosure is a superconducting system, and the quantum computer is provided with a control and reading device connected to the quantum chip. The control circuit described in some embodiments of the present disclosure includes a first magnetic flux modulation line and a pulse modulation line. The control and reading device uses a magnetic flux control signal on the first magnetic flux modulation line to adjust a frequency of the qubit to an operating frequency. In this case, a quantum state control signal is applied through the pulse modulation line to control a quantum state of the qubit in an initial state, and a quantum state of the controlled qubit is read by using a read resonant cavity. The control and reading device applies a read detection signal (for example, a microwave signal with a frequency of 4 to 8 GHz) to a readout circuit coupled to the read resonant cavity, and analyzes a read feedback signal (a signal in response to the read detection signal) outputted by the readout circuit to determine the quantum state of the qubit.

It is to be noted here that the quantum chip and the quantum circuit as referred to in the above embodiments of the quantum computer are similar to the structures in the above embodiments, and have the same beneficial effects as the above embodiments. Therefore, details are not described. For technical details not disclosed in the embodiments of the quantum computer in the present disclosure, those skilled in the art should refer to the description of the above embodiments for understanding. To save space, details are not described herein gain.

Manufacturing of a quantum chip provided in some embodiments of the present disclosure may entail deposition of one or more materials, such as superconductors, dielectrics and/or metals. Depending on the selected materials, these materials may be deposited by using a deposition process such as chemical vapor deposition or physical vapor deposition (e.g., evaporation or sputtering), or an epitaxial technology, and other deposition processes. Processes for manufacturing a quantum chip provided in some embodiments of the present disclosure may entail removal of one or more materials from a device during manufacturing. Depending on the material to be removed, the removal process may include, for example, a wet etching technology, a dry etching technology, or a lift-off process. The materials forming the circuit elements described herein may be patterned by using a known lithographic technology (e.g., photolithography or e-beam lithography).

The structure, features, and effects of the present disclosure have been described in detail with reference to the embodiments shown in the accompanying drawings. The above embodiments are only preferred embodiments of the present disclosure, but the implementation scope of the present disclosure is not limited to the accompanying drawings as shown. Any changes made according to the concept of the present disclosure, or equivalent embodiments that are modified to equivalent variations, should still fall within the protection scope of the present disclosure if they do not go beyond the spirit covered by the specification and the drawings.

What is claimed is:

1. A quantum circuit, comprising qubits, adjacent qubits being coupled, and each of the qubits comprising:
    a first capacitor, a first end of the first capacitor being grounded;
    a second capacitor, a first end of the second capacitor and the first end of the first capacitor being commonly grounded; and
    a first device, comprising a first squid and a third capacitor that are connected in parallel, wherein parallel-connected first ends of the first squid and the third capacitor are connected to a second end of the first capacitor, and parallel-connected second ends of the first squid and the third capacitor are connected to a second end of the second capacitor.

2. The quantum circuit according to claim 1, wherein
    the first capacitor comprises a first capacitive plate, the second capacitor comprises a second capacitive plate, and the third capacitor is formed between the first capacitive plate and the second capacitive plate;
    parallel-connected first ends of the first squid and the third capacitor being connected to a second end of the first capacitor comprises: the first end of the first squid is connected to the first capacitive plate; and
    parallel-connected second ends of the first squid and the third capacitor being connected to a second end of the second capacitor comprises: the second end of the first squid is connected to the second capacitive plate.

3. The quantum circuit according to claim 2, wherein
    the first capacitive plate comprises a first arm and a second arm that intersect with each other; and the second capacitive plate comprises a third arm and a fourth arm that intersect with each other.

4. The quantum circuit according to claim 3, wherein
    the first end of the first squid being connected to the first capacitive plate comprises: the first end of the first squid is connected to an intersection of the first arm and the second arm; and/or
    the second end of the first squid being connected to the second capacitive plate comprises: the second end of the first squid is connected to an intersection of the third arm and the fourth arm; or
    the adjacent qubits being coupled comprises:
    one of the first arm and the second arm of one of the qubits is coupled to one of the third arm and the fourth arm of an adjacent one qubit of the qubits.

5. The quantum circuit according to claim 3, wherein
    a coupling structure is further formed between two adjacent qubits.

6. The quantum circuit according to claim 5, wherein
    the coupling structure is coupled to one of the first arm and the second arm of one of the qubits, and is also coupled to one of the third arm and the fourth arm of another qubit adjacent to the one of the qubits.

7. The quantum circuit according to claim 5, wherein a frequency of the coupling structure is tunable.

8. The quantum circuit according to claim 5, wherein
    the coupling structure comprises a fourth capacitor having one end grounded, and
    a second squid connected in parallel with the fourth capacitor.

9. The quantum circuit according to claim 8, wherein
    the first squid comprises Josephson junctions connected in parallel; and/or the second squid comprises Josephson junctions connected in parallel.

10. The quantum circuit according to claim 9, wherein a number of the Josephson junctions in the second squid is an odd number.

11. The quantum circuit according to claim 9, wherein the Josephson junctions are tunnel junctions, point contacts, or have other structures exhibiting a Josephson effect.

12. The quantum circuit according to claim 11, wherein the quantum circuit further comprises a readout circuit, and the readout circuit is coupled to the qubits.

13. The quantum circuit according to claim 12, wherein the readout circuit comprises a fifth capacitor having one end grounded, and an inductor connected in parallel with the fifth capacitor.

14. The quantum circuit according to claim 12, wherein the readout circuit is capacitively coupled to the qubits.

15. The quantum circuit according to claim 1, wherein a capacitance value C1 of the first capacitor, a capacitance value C2 of the second capacitor, and a capacitance value C3 of the third capacitor satisfy: C1=C2, and $C_3 \leq C_2/100$.

16. The quantum circuit according to claim 1, wherein the qubits are arranged in an array on a substrate; and basic units arranged in the array form bit units, and the qubits of one bit unit of the bit units on a same straight line form a bit one-dimensional chain.

17. The quantum circuit according to claim 16, wherein at least 3 of the qubits form a bit one-dimensional chain, adjacent qubits in the bit one-dimensional chain are coupled, and a plurality of bit one-dimensional chains are sequentially coupled and connected end to end to form the bit unit;

preferably, the bit unit formed by the bit one-dimensional chains is in a shape of a quadrilateral, a pentagon, or a hexagon preferably, wherein the quadrilateral formed by the one-dimensional bit chains has a square shape or a rhombus shape.

18. The quantum circuit according to claim 17, the quantum circuit further comprising:

read resonant cavities and a control circuit, wherein the read resonant cavities are located in an internal space or external space of the bit unit, the control circuit is at least partially located in the internal space or external space of the bit unit, and the read resonant cavities and the control circuit are coupled to the qubits.

19. The quantum circuit according to claim 18, wherein the read resonant cavities coupled to the qubits in a same bit one-dimensional chain are distributed on a same side of the same bit one-dimensional chain; or wherein the read resonant cavities are all located in the internal space.

20. The quantum circuit according to claim 18, wherein the substrate comprises a first base and a second base; and the read resonant cavities being located in the internal space or external space of the bit unit, the control circuit being at least partially located in the internal space or external space of the bit unit, and the read resonant cavities and the control circuit being coupled to the qubits comprises:

a first part of the control circuit is located on the first base;

the bit unit, the read resonant cavities, and a second part of the control circuit are located on the second base; and the first part is coupled to the qubits, and the second part is electrically connected to the first part;

preferably, a second part of the control circuit being located on the second base comprises: a through-hole is formed in the second base, and the second part is located in the through-hole.

* * * * *